US009113580B2

(12) United States Patent
Dunwoody et al.

(10) Patent No.: US 9,113,580 B2
(45) Date of Patent: *Aug. 18, 2015

(54) COOLED UNIVERSAL HARDWARE PLATFORM

(71) Applicant: Birchbridge Incorporated, Belmont, CA (US)

(72) Inventors: John Craig Dunwoody, Belmont, CA (US); Teresa Ann Dunwoody, Belmont, CA (US)

(73) Assignee: Birchbridge Incorporated, Belmont, CA (US)

( * ) Notice: Subject to any disclaimer, the term of this patent is extended or adjusted under 35 U.S.C. 154(b) by 269 days.

This patent is subject to a terminal disclaimer.

(21) Appl. No.: 13/776,340

(22) Filed: Feb. 25, 2013

(65) Prior Publication Data
US 2013/0194750 A1 Aug. 1, 2013

Related U.S. Application Data

(63) Continuation of application No. 12/840,824, filed on Jul. 21, 2010, now Pat. No. 8,411,440.

(51) Int. Cl.
H05K 7/20 (2006.01)
(52) U.S. Cl.
CPC ........ H05K 7/20781 (2013.01); H05K 7/20645 (2013.01)
(58) Field of Classification Search
CPC .................................. H05K 7/20536–7/20836
USPC ........................ 361/679.46–679.54, 688–723
See application file for complete search history.

(56) References Cited

U.S. PATENT DOCUMENTS

| 3,675,083 | A | 7/1972 | White |
| 3,800,097 | A | 3/1974 | Maruscak et al. |
| 4,511,950 | A | 4/1985 | Bunner et al. |
| 4,514,746 | A | 4/1985 | Lundqvist |
| 4,685,032 | A | 8/1987 | Blomstedt et al. |
| 4,938,279 | A | 7/1990 | Betker |
| 5,006,961 | A | 4/1991 | Monico |
| 5,390,081 | A | 2/1995 | St. Pierre |
| 5,450,272 | A | 9/1995 | Van Gaal et al. |
| 5,603,044 | A | 2/1997 | Annapareddy et al. |
| 5,971,804 | A | 10/1999 | Gallagher et al. |

(Continued)

FOREIGN PATENT DOCUMENTS

WO WO 2012/012611 A2 1/2012

OTHER PUBLICATIONS

PCT International Search Report for application PCT/US2011/044809 mailed Jan. 31, 2012.

*Primary Examiner* — Zachary M Pape
(74) *Attorney, Agent, or Firm* — Alston & Bird LLP

(57) ABSTRACT

Disclosed is an embodiment of a rack system including a cooled universal hardware platform having a frame, a module insertion area on a first side of the rack system and a universal backplane mounting area on a second side of the rack system opposite to the first side, a power bus, a plurality of cooled partitions, a plurality of module bays, two or more service unit backplanes and a coolant source. The power bus may be configured to provide power to the universal backplane mounting area and the plurality of cooled partitions. The rack system may also include a plurality of service units that may be configured to have different functions within the rack system.

20 Claims, 9 Drawing Sheets

(56) References Cited

U.S. PATENT DOCUMENTS

| | | |
|---|---|---|
| 5,991,163 A | 11/1999 | Marconi et al. |
| 6,195,493 B1 | 2/2001 | Bridges |
| 6,310,783 B1 | 10/2001 | Winch et al. |
| 6,365,964 B1 | 4/2002 | Koors et al. |
| 6,498,716 B1 | 12/2002 | Salinas et al. |
| 6,536,510 B2 | 3/2003 | Khrustalev et al. |
| 6,629,614 B2 | 10/2003 | Jordan |
| 6,768,651 B2 * | 7/2004 | Takahashi et al. ............ 361/801 |
| 6,836,030 B2 | 12/2004 | Smith et al. |
| 7,051,215 B2 | 5/2006 | Zimmer et al. |
| 7,076,592 B1 | 7/2006 | Ykema |
| 7,138,733 B2 | 11/2006 | Sanders et al. |
| 7,222,339 B2 | 5/2007 | Rothman et al. |
| 7,278,273 B1 | 10/2007 | Whitted et al. |
| 7,312,987 B1 | 12/2007 | Konshak |
| 7,389,046 B1 | 6/2008 | Tanaka et al. |
| 7,408,775 B2 | 8/2008 | Walz et al. |
| 7,508,670 B1 | 3/2009 | Thorson et al. |
| 7,511,959 B2 | 3/2009 | Belady et al. |
| 7,511,960 B2 | 3/2009 | Hillis et al. |
| 7,551,971 B2 | 6/2009 | Hillis |
| 7,552,758 B2 * | 6/2009 | Garner et al. ................ 165/80.4 |
| 7,597,582 B2 | 10/2009 | Nehling et al. |
| 7,619,893 B1 | 11/2009 | Yu |
| 7,646,109 B2 | 1/2010 | Belady et al. |
| 7,673,389 B2 | 3/2010 | Lehman et al. |
| 7,713,068 B2 | 5/2010 | Flynn et al. |
| 7,715,207 B2 | 5/2010 | Behrens et al. |
| 7,724,513 B2 | 5/2010 | Coglitore et al. |
| 7,738,251 B2 | 6/2010 | Clidaras et al. |
| 7,852,627 B2 | 12/2010 | Schmitt et al. |
| 7,854,652 B2 | 12/2010 | Yates et al. |
| 7,856,838 B2 | 12/2010 | Hillis et al. |
| 7,894,945 B2 | 2/2011 | Hillis |
| 7,907,409 B2 | 3/2011 | Wyatt et al. |
| 7,952,023 B2 | 5/2011 | Caveney et al. |
| 7,952,873 B2 | 5/2011 | Glahn et al. |
| 7,957,144 B2 | 6/2011 | Goettert et al. |
| 7,983,194 B1 | 7/2011 | Genetti et al. |
| 7,990,710 B2 | 8/2011 | Hellriegel et al. |
| 8,047,904 B2 | 11/2011 | Yates et al. |
| 8,077,457 B2 | 12/2011 | Gauthier et al. |
| 8,094,453 B2 | 1/2012 | Campbell et al. |
| 8,259,450 B2 | 9/2012 | Dunwoody et al. |
| 8,410,364 B2 | 4/2013 | Dunwoody et al. |
| 8,411,440 B2 | 4/2013 | Dunwoody et al. |
| 8,441,792 B2 | 5/2013 | Dunwoody et al. |
| 8,441,793 B2 | 5/2013 | Dunwoody et al. |
| 2003/0112582 A1 | 6/2003 | Sanders et al. |
| 2004/0221604 A1 | 11/2004 | Ota et al. |
| 2005/0021847 A1 | 1/2005 | Rothman et al. |
| 2005/0213306 A1 | 9/2005 | Vos et al. |
| 2006/0082263 A1 | 4/2006 | Rimler et al. |
| 2007/0247825 A1 | 10/2007 | Bynum et al. |
| 2008/0055846 A1 | 3/2008 | Clidaras et al. |
| 2008/0094797 A1 | 4/2008 | Coglitore et al. |
| 2008/0205003 A1 | 8/2008 | Belady |
| 2008/0259555 A1 | 10/2008 | Bechtolsheim et al. |
| 2009/0126910 A1 | 5/2009 | Campbell et al. |
| 2009/0159241 A1 | 6/2009 | Lipp et al. |
| 2009/0229194 A1 | 9/2009 | Armillas |
| 2009/0237887 A1 * | 9/2009 | Shibata ........................ 361/709 |
| 2009/0301123 A1 | 12/2009 | Monk et al. |
| 2010/0020806 A1 | 1/2010 | Vahdat et al. |
| 2010/0051563 A1 | 3/2010 | Schreiber |
| 2010/0165565 A1 | 7/2010 | Hellriegal et al. |
| 2010/0254096 A1 | 10/2010 | Kim et al. |
| 2011/0119344 A1 | 5/2011 | Eustis |
| 2011/0157829 A1 | 6/2011 | Wormsbecher et al. |
| 2011/0175498 A1 | 7/2011 | Bash et al. |
| 2011/0175499 A1 | 7/2011 | Zhao et al. |
| 2011/0239680 A1 | 10/2011 | Dechene et al. |
| 2012/0020349 A1 | 1/2012 | Dunwoody et al. |
| 2013/0135811 A1 | 5/2013 | Dunwoody et al. |
| 2013/0322012 A1 | 12/2013 | Dunwoody et al. |
| 2014/0268554 A1 | 9/2014 | Dunwoody et al. |
| 2015/0009624 A1 | 1/2015 | Dunwoody et al. |

* cited by examiner

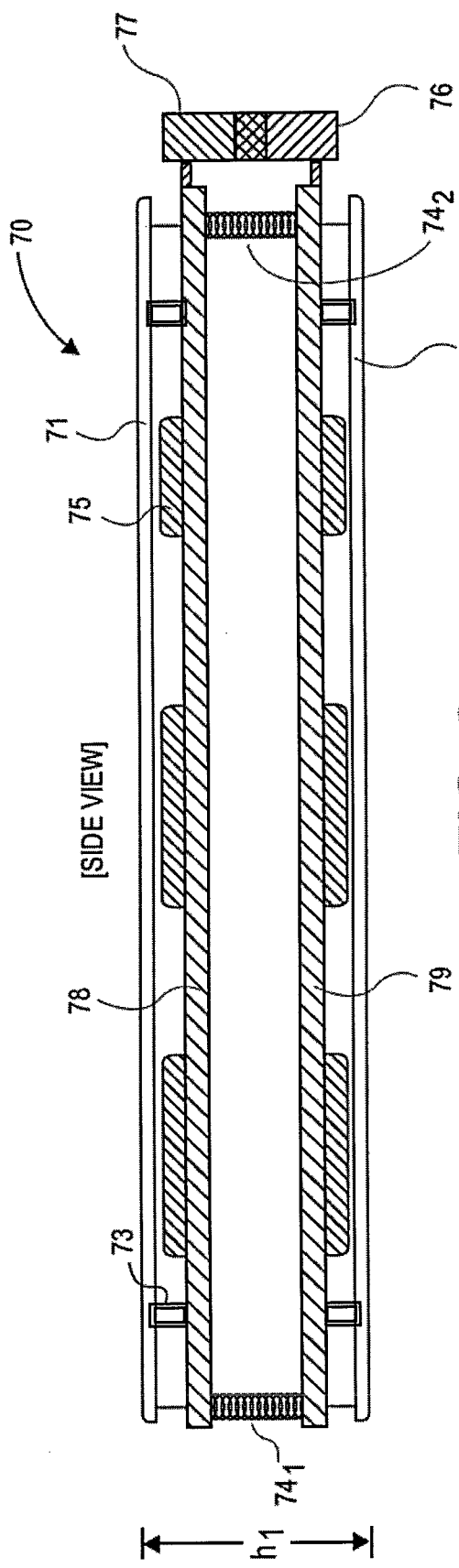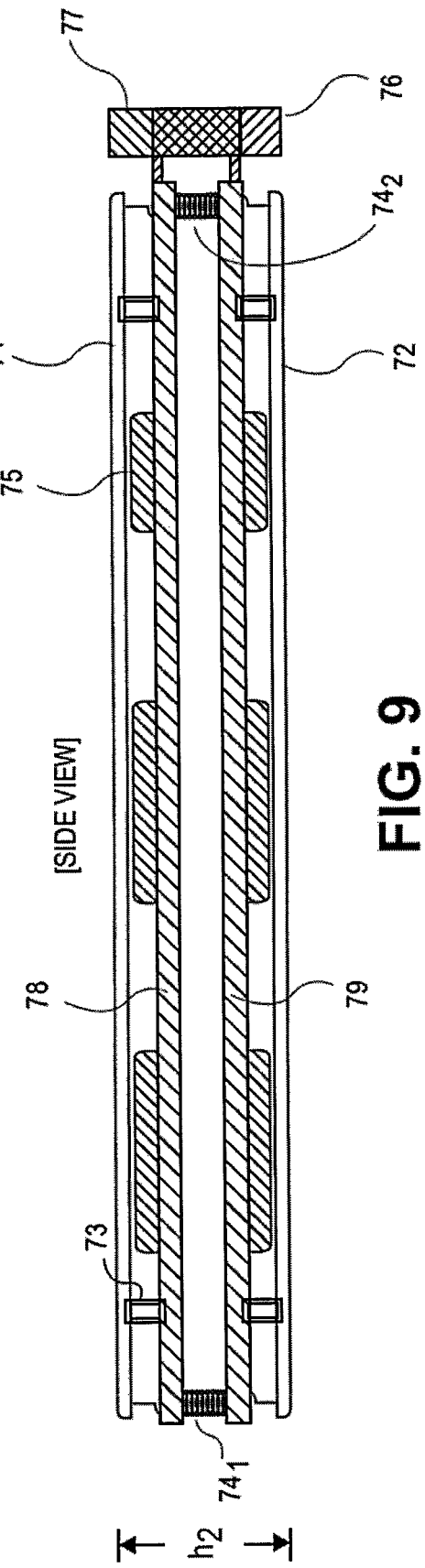

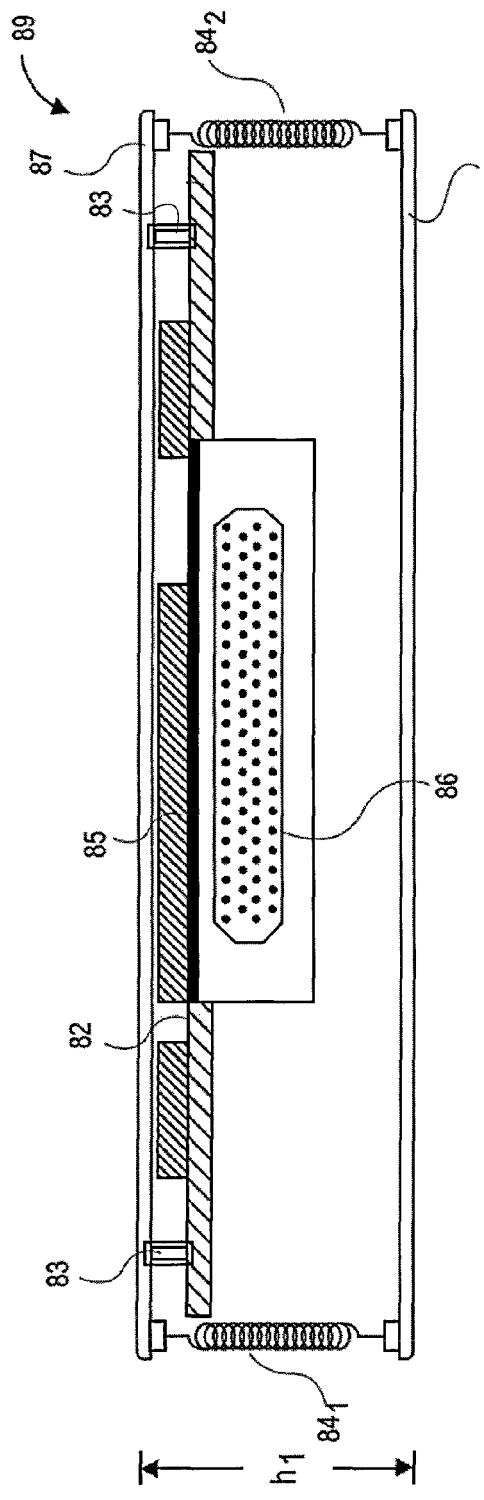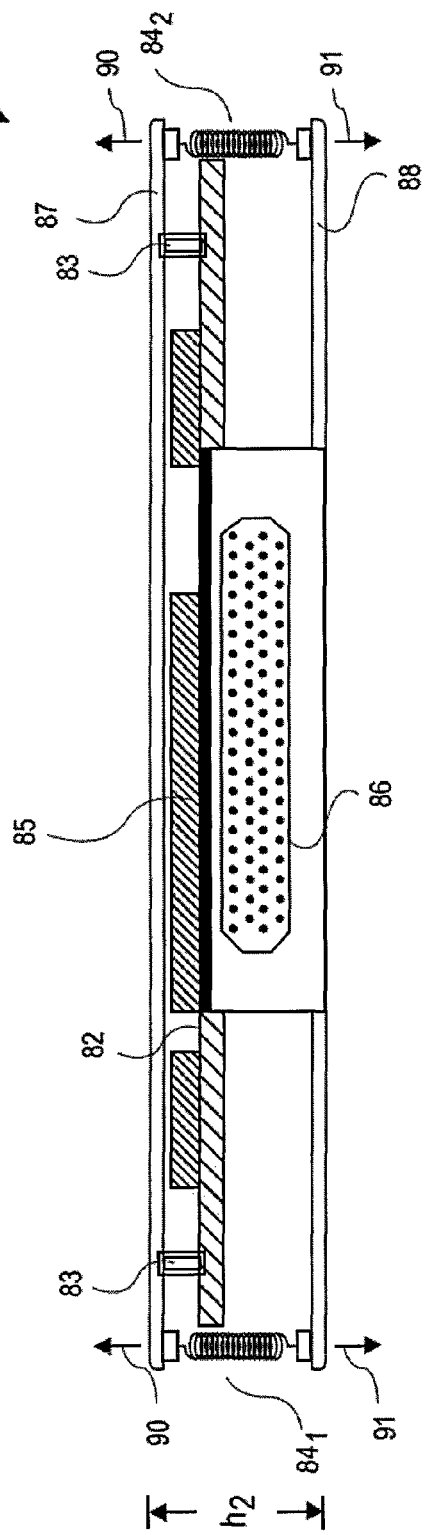

COOLED UNIVERSAL HARDWARE PLATFORM

RELATED APPLICATIONS

This application is a continuation of U.S. patent application Ser. No. 12/840,824, which is related to U.S. patent application Ser. Nos. 12/840,808, 12/840,871, 12/840,857 (now U.S. Pat. No. 8,259,450) and Ser. No. 12/840,788, each filed Jul. 21, 2010, and each incorporated herein by reference in its entirety.

FIELD

This application relates to rack mounted processing systems.

BACKGROUND

Current standard rack configurations are measured in rack-units (RUs). For example, a blade server may have a rack unit measuring 19 inches wide and having a pitch of 1.75 inches in height. A common computer rack form-factor is 42 RU high, which is a factor in limiting the density or number of components directly mountable into a rack. Higher density component systems are desirable since they require less space per rack enclosure and ultimately less space within the building housing the enclosures. Often these buildings must include high price high maintenance false floors to accommodate the mass of cabling and the delivery of chilled air and power to the enclosures. Another factor in determining component density is the pitch of the rack unit as often limited by the space required for component heat sinks and associated cooling components (e.g., fans).

Of particular concern is the cooling of the rack's components. During operation, the electrical components produce heat, which a system must displace to ensure the proper functioning of its components. In addition to maintaining normative function, various cooling methods, such as liquid or air cooling, are used to either achieve greater processor performance (e.g., overclocking), or to reduce the noise pollution caused by typical cooling methods (e.g., cooling fans and heat sinks). A frequently underestimated problem when designing high-performance computer systems is the discrepancy between the amount of heat a system generates, particularly in high performance and high density enclosures, and the ability of its cooling system to remove the heat uniformly throughout the rack enclosure.

SUMMARY

In one embodiment, a rack system includes a cooled universal hardware platform having a frame, a module insertion area on a first side of the rack system and a universal backplane mounting area on a second side of the rack system opposite to the first side, a power bus, a plurality of cooled partitions, a plurality of module bays, two or more service unit backplanes and a coolant source.

The power bus may be configured to provide power to the universal backplane mounting area and the plurality of cooled partitions, in one embodiment, is coupled within the frame perpendicular to the first side of the rack. A module bay of the plurality of module bays may be defined by a volume of space between each consecutive cooled partition of the plurality of cooled partitions. In one embodiment each module bay has a pitch (P) equal to the distance between the first surface of one cooled partition to the second surface of an adjacent cooled partition.

In one embodiment, the two or more service unit backplanes are coupled to the universal backplane mounting area and to the power bus. Each service unit backplane may include one or more connectors configured to connect to modules of corresponding two or more service units. In various embodiments, each service unit may be configured to have different functions within the rack system.

In one embodiment a coolant source is coupled to the plurality of cooled partitions, wherein each cooled partition may include capillaries between a first surface and a second surface of each cooled partition to permit coolant flow within thus providing cooling the two or more service units.

In one embodiment the universal backplane mounting area may include a plurality backplane board mounts, wherein a vertical distance between any two mounts is configured to conform to a multiple of a standard unit of height. The board mounts may be holes configured to be used in conjunction with a fastener and a service unit backplane configured to conform to a multiple of the standard unit of height. In another embodiment, the board mounts may be protruding elements configured to be used in conjunction with a fastener and a service unit backplane configured to conform to a multiple of the standard unit of height. Additionally, according to one embodiment the pitch (P) may corresponds with the standard unit of height, which may be, for example, 0.75 inches.

In one embodiment, the platform includes a rack power unit coupled within the frame and comprised of one or more rack power modules to convert alternating current (AC) to direct current (DC). The power bus may be coupled to the one or more rack power modules to deliver DC to the one or more service unit backplanes. The rack power unit may be configured to convert 480 volt three-phase AC to 380 volt DC and provide it to the power bus. In one embodiment each of the one or more rack power modules is configured to collectively convert the 480 volt three-phase AC to 380 volt DC. In another embodiment, the power bus is coupled to a 380 volt DC source external to the frame.

In one embodiment each cooled partition of the plurality of cooled partitions includes a first coolant distribution node located at a first edge of the cooled partition and coupled to the coolant source by a first coolant pipe, wherein the first coolant distribution node is configured to uniformly distribute coolant within the cooled partition. Each cooled partition may also include a second coolant distribution node located at a second edge of the cooled partition and configured to receive coolant after is passes from the first coolant distribution node and through the cooled partition, the second coolant distribution node coupled to a second coolant pipe leading out of the universal hardware platform.

In one embodiment each of the first coolant distribution nodes of each cooled partition is coupled to the coolant source by the first coolant pipe and each of the second coolant distribution nodes of each cooled partition is coupled to the coolant source by the second coolant pipe.

In one embodiment each service unit is comprised of at least one component module inserted into at least one of the plurality of module bays.

In one embodiment each component module includes a first thermal plate substantially parallel to a second thermal plate, wherein each thermal plate includes an inner surface facing each other and an outer surface opposite to the inner surface. Each thermal plate may be configured to physically and thermally couple to its inner surface one or more component units.

In one embodiment the cooled universal hardware platform includes one or more tensioning units coupled to and locatable between the first and the second thermal plate. The one or more tensioning units may be configured to provide a contact bias between the outer surface of each thermal plate and each surface of the cooled partitions comprising a module bay when the component module is inserted into the module bay. Each component unit may include at least one connector configured to connect into a service unit backplane and the at least one connector may be configured to overlap at least one of the first thermal plate and the second thermal plate when inserted into one of the plurality of module bays.

In one embodiment a minimum pitch (P) of a module bay is determined by the distance between the first thermal plate and the second thermal plate and the at least one overlapping connector.

BRIEF DESCRIPTION OF THE DRAWINGS

The present invention is illustrated by way of example, and not by way of limitation, in the figures of the accompanying drawings in which:

FIGS. 8 and 9 illustrate embodiments of the module fixture from a side view in a compressed and uncompressed state respectively;

FIGS. 10 and 11 illustrate embodiments of a module fixture for a rack power board insertable into the rack power section of the rack system;

DETAILED DESCRIPTION

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

Embodiments of the present invention generally relate to an architecture for a scalable modular data system. In this regard, embodiments of the present invention relate to a rack system (e.g., rack system 10) that may contain a plurality of service units or modules. The rack system described herein provides physical support, power, and cooling for the service units or modules contained therein. The rack system also provides a set of interfaces for the service units or modules including mechanical, thermal, electrical, and communication protocol specifications. Moreover, the rack system described herein may be easily networked with a plurality of instances of other rack systems to create the highly scalable modular architecture referenced above.

Each service unit or module that may be housed in the rack system provides some combination of processing, storage, and communication capacity enabling the service units to provide functional support for various computing, data processing and storage activities (e.g., as servers, storage arrays, network switches, etc.). However, embodiments of the present invention provide a mechanical structure for the rack system and the service units or modules that provides for efficient heat removal from the service units or modules in a compact design. Thus, the amount of processing capability that can be provided for a given amount of energy consumption may be increased.

Figure 1:
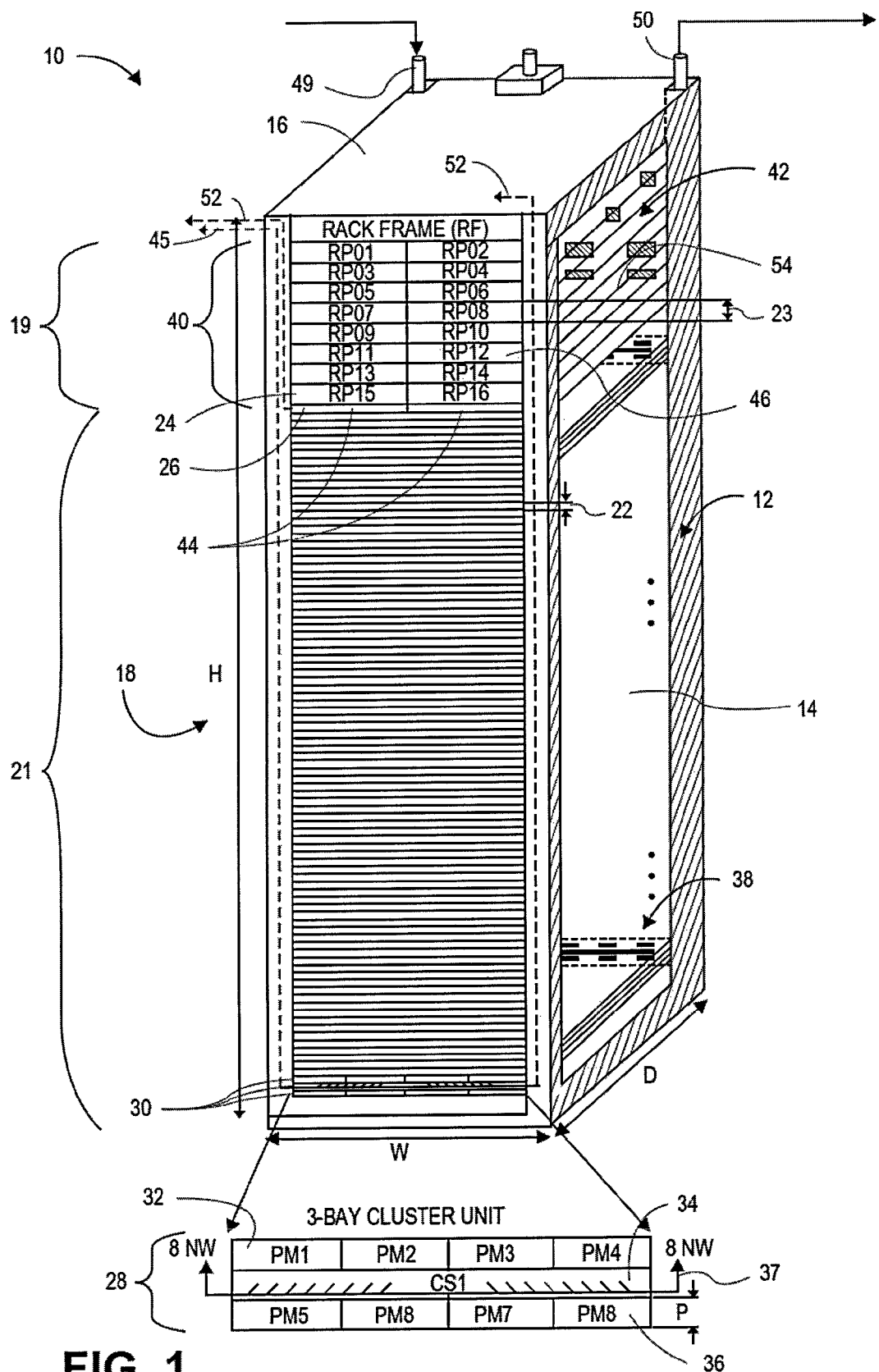
FIG. 1 illustrates an embodiment of a rack system including a cooled universal hardware platform.

FIG. 1 illustrates an embodiment of a rack system 10. Rack system 10 includes a rack power section 19 and a universal hardware platform 21. The universal hardware platform 21 includes a universal backplane mounting area 14. The rack system 10 has a perimeter frame 12 having a height 'H' width 'W' and depth 'D.' In one embodiment, the perimeter frame 12 includes structural members around the perimeter of the rack system 10 and is otherwise open on each vertical face. In other embodiments some or all of the rack's faces or planes may be enclosed, as illustrated by rack top 16.

The front side of the rack, rack front 18, may include a multitude of cooled partitions substantially parallel to each other and at various pitches, such as pitch 22 (P), where the pitch may be equal to the distance between the first surface of one cooled partition to the second surface of an adjacent cooled partition. The area or volume between each partition defines a module bay, such as module bay 24 or module bay 26. Each module bay may have a different size based on their respective pitches, such as pitch 22 corresponding to module bay 26 and pitch 23 corresponding to module bay 24. It can be appreciated that the pitch may be determined any number of ways, such as between the mid lines of each partition or between the inner surfaces of two consecutive partitions. In one embodiment, the pitch 22 is a standard unit of height, such as 0.75 inches, and variations of the pitch, such as pitch 23, may be a multiple of the pitch 23. For example, pitch 23 is two times the pitch 22, where pitch 22 is the minimum pitch based on module or other design constraints.

The rack system 10, and specifically the universal hardware platform 21, may be configured to include a multitude of service units. Each service unit may provide a combination of data processing capacity, data storage capacity, and data communication capacity. In one embodiment the rack system 10 provides physical support, power, and cooling for each service unit that it contains. A service unit and its corresponding service unit backplane correspond to a rack unit model. The rack unit model defines a set of interfaces for the service unit, which include mechanical, thermal, electrical, and communication-protocol specifications. Thus, any service unit that conforms to the interfaces defined by a particular rack unit model may be installed and operated in a rack system that includes the corresponding service unit backplane. For example, the service unit backplane mounts vertically to the universal backplane mounting area 14 and provides the connections according to the rack unit model for all of the modules that perform the functions of the service unit.

Cluster unit 28 is an example of a service unit configured to provide processing and switching functions to sixteen data nodes. In this embodiment, the cluster unit 28 spans over three module bays, module bays 30, and includes eight processing modules and a cluster switch. Specifically, the cluster unit 28 includes the four processing modules 32 (PM1-PM4) in the first module bay, a cluster switch 34 (CS1) in the second module bay, and the remaining processing modules 36 (PM5-PM8) in the third module bay.

Each of these modules may slide into their respective slots with the module bay and connect into a service unit backplane, such as cluster unit backplane 38. The cluster unit backplane 38 may be fastened to the perimeter frame 12 in the universal backplane mounting area 14. The combination of the cluster switch 34 and the cluster unit backplane 38 in this embodiment has the advantage of signal symmetry, where the signal paths of the processing modules 32 and 36 are equidistant to the cluster switch 34.

In one embodiment, the cluster switch 34 has 8 network lines exiting out of the front of the cluster switch 34 at a forty-five degree angle toward each side of the rack front 18, see for example network lines 37. For simplicity, only one cluster switch (e.g., cluster switch 34) is shown, however it can be appreciated that a multitude of cluster switches may be included in the rack system 10. Thus, the network lines for every installed cluster switch may run up the perimeter frame 12 and exit the rack top 16 in a bundle, as illustrated by net 52.

In various embodiments, some or all of the service units, such as the cluster unit 28 including the processing modules 32 and the cluster switch 34, are an upward-compatible enhancement of mainstream industry-standard high performance computing (HPC)-cluster architecture, with x86_64 instruction set architecture (ISA) and standard Infiniband networking interconnects. This enables one hundred percent compatibility with existing system and application software used in mainstream HPC cluster systems and is immediately useful to end-users upon product introduction, without extensive software development or porting. Thus, implementation of these embodiments includes using commercial off the shelf (COTS) hardware and firmware whenever possible, and does not include any chip development or require the development of complex system and application software. As a result, these embodiments dramatically reduce the complexity and risk of the development effort, improve energy efficiency, and provide a platform to enable application development for concurrency between simulation and visualization computing to thereby reducing data-movement bottlenecks. The efficiency of the architecture of the embodiments applies equally to all classes of scalable computing facilities, including traditional enterprise-datacenter server farms, cloud/utility computing installations, and HPC clusters. This broad applicability maximizes the ability for significant improvements in energy and environmental efficiency of computing infrastructures. However, it should be noted that custom circuit and chip designs could also be used in the disclosed rack system design, but would not likely be as cost effective as using COTS components.

Returning to the discussion of FIG. 1, the cluster unit backplane 38 may be a single circuit board with connectors corresponding to their counterpart connectors on each module of the cluster unit 28, and the cluster unit backplane 38 may have a height of approximately the height of the (three) module bays 30. In other embodiments, the cluster unit backplane 38 may be composed of two or more circuit boards with corresponding connectors, or the cluster unit backplane 38 may be single circuit board that supports two or more cluster units (e.g., cluster unit 28) over a multitude of module bays.

The optional rack power section 19 of the rack system 10 may include rack power and management unit 40 composed of two rack management modules 44 and a plurality of rack power modules 46 (e.g., RP01-RP16). In another embodiment, the rack management modules 44 and a corresponding rack management backplane (not shown) may be independent of the rack power unit 40 and may be included in the universal hardware platform 21. In one embodiment, there may be two modules per module bay, such as the two rack power modules in module bay 24 and the two rack management modules 44 in module bay 26.

The rack management modules 44 may provide network connectivity to every module installed in the rack system 10. This includes every module installed in the universal hardware platform 21 and every module of the rack power section 19. Management cabling 45 provides connectivity from the rack management modules 44 to devices external to the rack system 10, such as networked workstation or control panel (not shown). This connectivity may provide valuable diagnostic and failure data from the rack system 10 and in some embodiments provide an ability to control various service units and modules within the rack system 10.

As with the backplane boards of the universal hardware platform 21, the back plane area corresponding to the rack power section 19 may be utilized to fasten one or more backplane boards. In one embodiment, a rack power and management backplane 42 is a single backplane board with connectors corresponding to their counterpart connectors on each of the rack management modules 44 and the rack power modules 46 of the rack power and management unit 40. The rack power and management backplane 42 may then have a height of approximately the height of the collective module bays corresponding to the rack power and management unit 40. In other embodiments, the rack power and management backplane 42 may be composed of two or more circuit boards with corresponding connectors.

Figure 13:
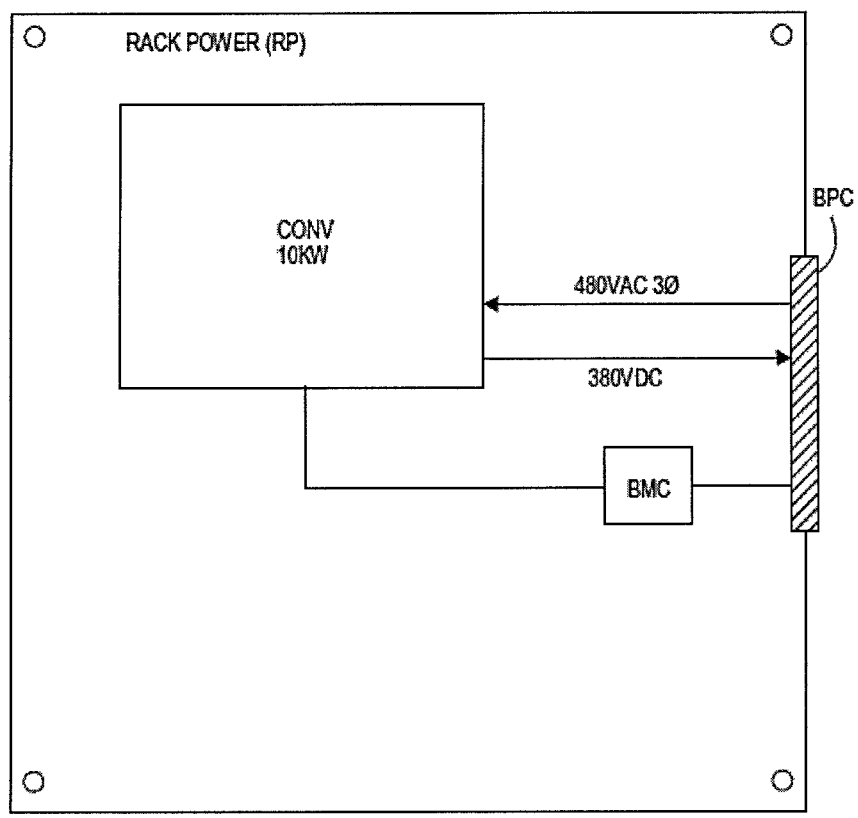
FIG. 13 illustrates a block diagram of a rack power module according to an example embodiment.

In one embodiment, the rack power modules 46 are connected to the power inlet 48 (See e.g., FIGS. 2 and 3), which may be configured to receive three-phase alternating current (AC) power from a source external to the rack system 10. The rack power modules 46 convert the three-phase AC into direct current (DC). For example, the rack power modules 46 may convert a 480 volt three-phase AC input to 380 volt DC for distribution in the rack system 10. FIG. 13 illustrates a block diagram of a rack power module according to an example embodiment. In this regard, the rack power module of FIG. 13 includes a backplane connector (BPC) that connects the rack power module to the backplane. The rack power module also includes a power converter for converting 480 volt three-phase AC input to 380 volt DC and a baseboard management controller (BMC) that enables the rack power module to be addressed via the Ethernet for power status inquiries, temperature inquiries and other requests. In one embodiment, the DC voltage from the rack power modules 46 is connected to power bus 67 (See e.g., FIGS. 2 and 3) running down from the rack power and management backplane 42 to other service unit backplanes, such as the cluster unit backplane 38.

The rack system 10 may include a coolant system having a coolant inlet 49 and coolant outlet 50. The coolant inlet 49 and the coolant outlet 50 are connected to piping running down through each partition's coolant distribution nodes (e.g., coolant distribution node 54) to provide the coolant into and out of the cooled partitions. For example, coolant (refrigerant R-134a) flows into the coolant inlet 49, through a set of vertically spaced, 0.1 inch thick horizontal cooled partitions (discussed below with reference to FIGS. 3 and 4) and out of the coolant outlet 50. As discussed above, the space between each pair of adjacent cooled partitions is a module bay. Waste heat is transferred via conduction, first from the components within each module (e.g., processing modules 32) to the module's top and bottom surfaces, and then to the cooled partitions at the top and bottom of the module bay (e.g., module bays 30). Other coolant distribution methods and hardware may also be used without departing from the scope of the embodiments disclosed herein.

Thus, embodiments of the rack system 10 including one or all of the compact features based on modularity, cooling, power, pitch height, processing, storage and networking provide, among others, energy efficiency in system manufacturing, energy efficiency in system operation, cost efficiency in system manufacturing and installation, cost efficiency in system maintenance, space efficiency of system installations, and environmental impact efficiency throughout the system lifecycle.

Figure 2:
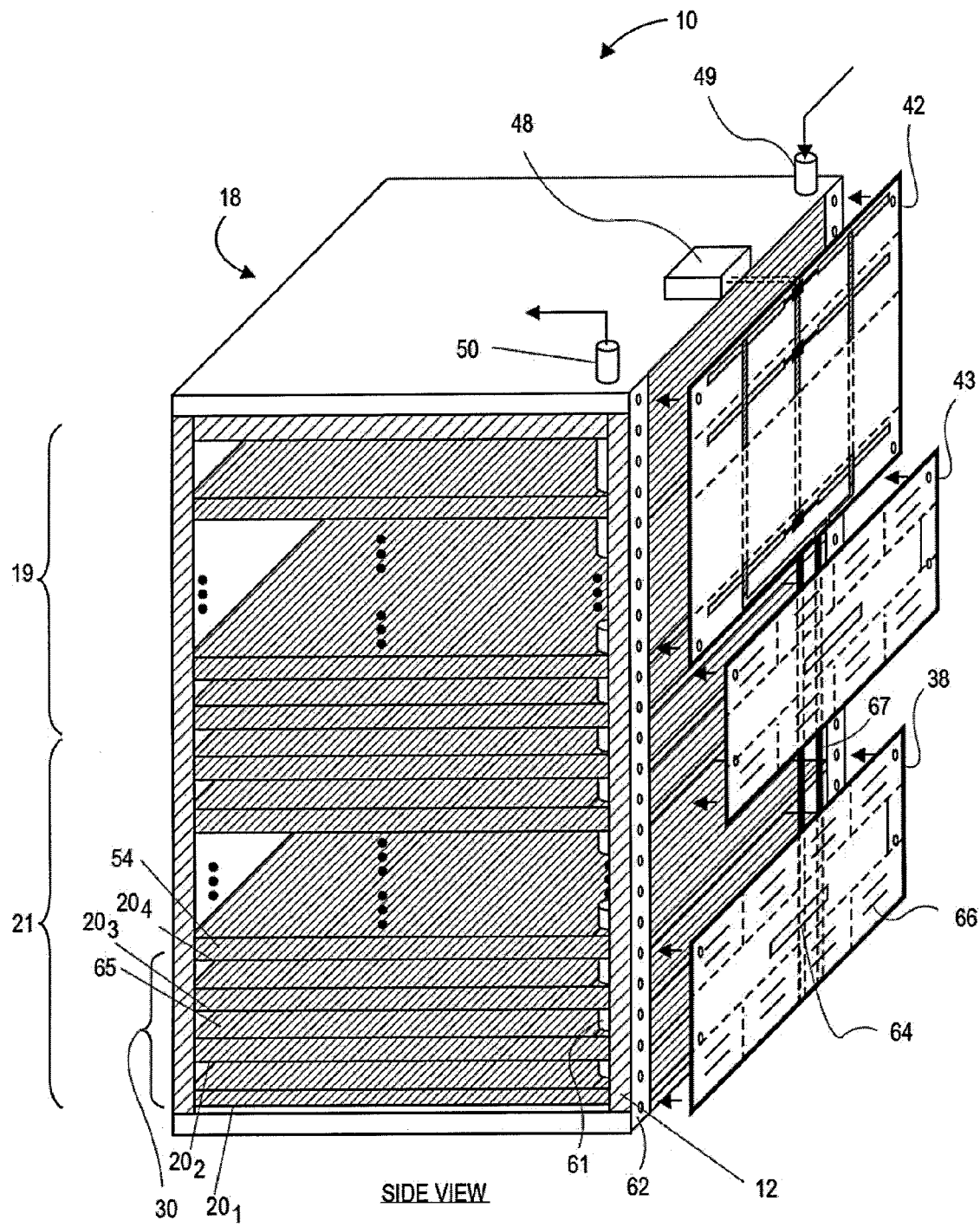
FIG. 2 illustrates a portion of the side of the rack system and the cooled universal hardware platform, according to one embodiment.

FIG. 2 illustrates a portion of the side of the rack system 10, according to one embodiment. FIG. 2 shows the rack power section 19 and the universal hardware platform 21 as seen form an open side and rear perspective of the rack system 10. The three module bays of the module bays 30 are made up of four cooled partitions, cooled partitions $20_1$, $20_2$, $20_3$, and $20_4$. Each module bay includes two partitions, in this embodiment an upper and a lower partition. For example, module bay 65 is the middle module bay of the three module bays, module bays 30, and has cooled partition $20_2$ as the lower cooled partition and $20_3$ as the upper cooled partition. As will be discussed in further detail below, functional modules may be inserted into module bays, such as module bay 65, and thermally couple to the cooled partitions to cool the modules during operation.

The coolant distribution node 54 is illustrated on cooled partition $20_4$, and in this embodiment, is connected to the coolant distribution nodes of other cooled partitions throughout the rack via coolant pipe 61 running up the height of the rack and to the coolant outlet 50. Similarly, coolant pipe 63 (See e.g., FIG. 5) is connected to the opposite end of each of the cooled partitions at a second coolant distribution node and the coolant inlet 49.

The perimeter frame 12 of the rack system 10 may include a backplane mounting surface 62 where the service unit backplanes are attached to the perimeter frame 12, such as the cluster unit backplanes 38 and 43 of the universal hardware platform 21, and the rack power and management backplane 42 of the rack power section 19. In various embodiments, the backplane mounting surface 62 may include mounting structures that conform to a multiple of a standard pitch size (P), such as pitch 22 shown in FIG. 1. The mounting structures on the surface of the service unit backplanes as well as the backplanes themselves may be configured to also conform with the standard pitch size. For example, the cluster unit backplane 38 may have a height of approximately the height of module bays 30 corresponding to a pitch of 3P, and accordingly the structures of the backplane mounting surface 62 are configured to align with the mounting structures of the cluster unit backplane 38.

In various embodiments, the mounting structures for the backplane mounting surface 62 and the service units (e.g., cluster unit 28) may be magnetic, rails, indentations, protrusions, bolts, screws, or uniformly distributed holes that may be threaded or configured for a fastener (e.g., bolt, pin, etc.) to slide through, attach or snap into. Embodiments incorporating the mounting structures set to a multiple of the pitch size have the flexibility to include a multitude of backplanes corresponding to various functional types of service units that may be installed into the module bays of the universal hardware platform 21 of the rack system 10.

When mounted, the service unit backplanes provide a platform for the connectors of the modules (e.g., processing modules 36 of service unit 28) to couple with connectors of the service unit backplane, such as the connectors 64 and 66 of the cluster unit backplane 38 and the connectors associated with the modules of cluster unit 28 described above. The connectors are not limited to any type and may be, for example, an edge connector, pin connector, optical connector, or any connector type or equivalent in the art. Because multiple modules may be installed into a single module bay, the cooled partitions may include removable, adjustable or permanently fixed guides (e.g., flat brackets or rails) to assist with the proper alignment of the modules with the connectors of the backplane upon module insertion. In another embodiment, a module and backplane may include a guide pin and corresponding hole (not shown), respectively, to assist in module alignment.

Figure 3:
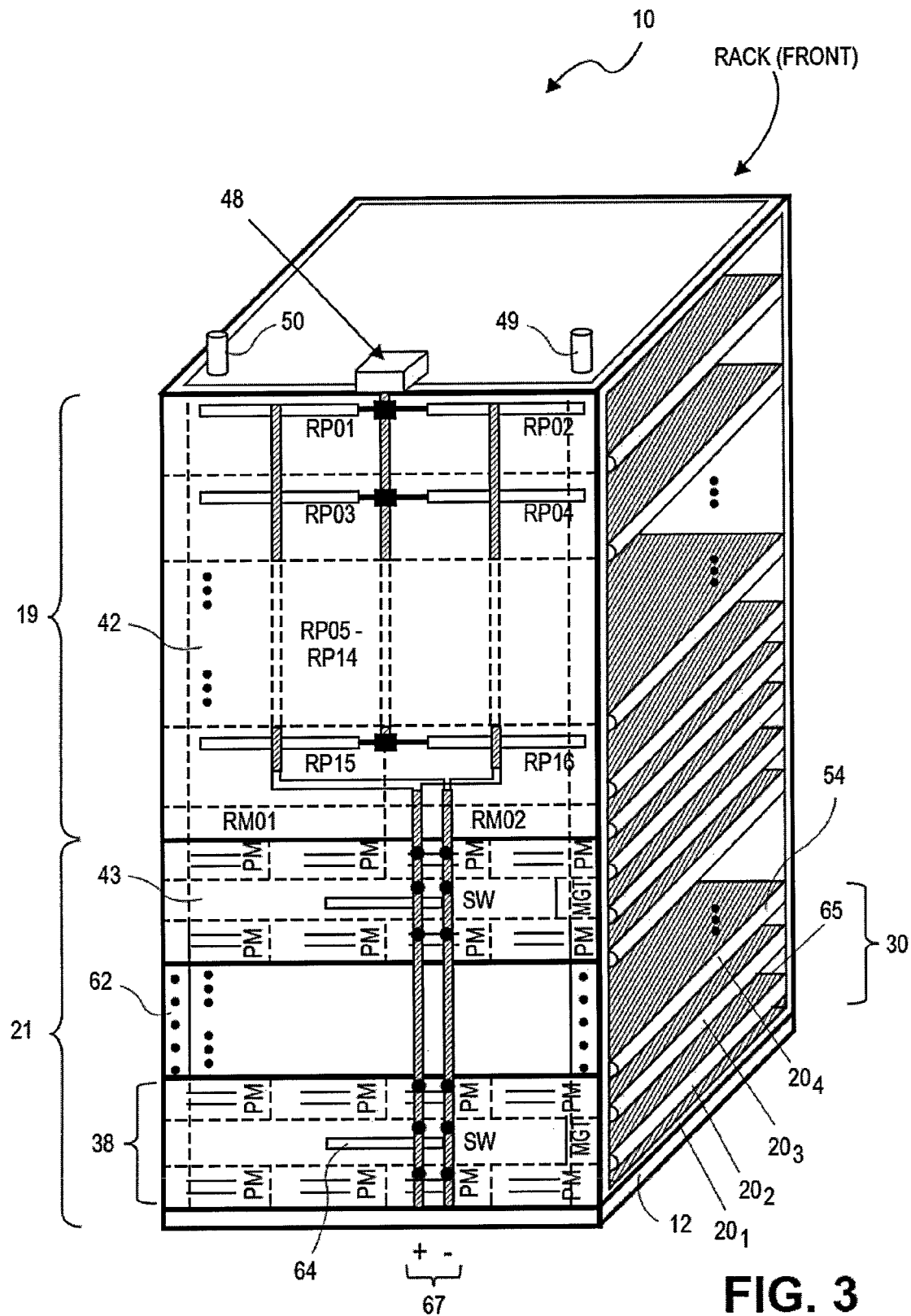
FIG. 3 illustrates an embodiment of rack system and specifically the rear portion and the open side of the rack and the cooled universal hardware platform.

FIG. 3 is an embodiment of rack system 10 illustrating the rear portion and the open side of the rack. As shown, FIG. 3 only represents a portion of the entire rack system 10, and specifically, only portions of the rack power section 19 and the universal hardware platform 21. This embodiment illustrates the power inlet 48 coupled to a power bus 67 via the rack power and management backplane 42, which as previously mentioned may convert AC power from the power inlet 48 to DC power for distribution to the service units via the service unit backplanes of the universal hardware platform 21.

In one embodiment, the power bus 67 includes two solid conductors; a negative or ground lead and a positive voltage lead connected to the rack power and management backplane 42 as shown. The power bus 67 may be rigidly fixed to the rack power and management backplane 42 or may only make electrical connection but be rigidly fixed to the backplanes as needed, such as the cluster unit backplanes 38 and 43. In another embodiment where DC power is supplied directly to the power inlet 48, the power bus 67 may be insulated and rigidly fixed to the rack system 10. Regardless of the embodiment, the power bus 67 is configured to provide power to any functional type of backplane mounted in the universal hardware platform 21. The conductors of the power bus 67 may be electrically connected to the service unit backplanes by various connector types. For example, the power bus 67 may be a metallic bar which may connect to each backplane using a bolt and a clamp, such as a D-clamp.

FIG. 3 also illustrates another view of the cooled partitions of the rack system 10. This embodiment shows the coolant distribution node 54 that is part of the cooled partitions shown, such as the cooled partitions $20_1$, $20_2$, $20_3$, and $20_4$ of module bays 30, and also shows a side view of the middle module bay, module bay 65. As discussed above, the coolant distribution node 54 may be connected to the coolant distribution nodes of the other cooled partitions via coolant pipes 61 and 63 (see e.g., FIGS. 2 and 5) running up the rack and to the coolant inlet 49 and the coolant outlet 50.

Figure 4:
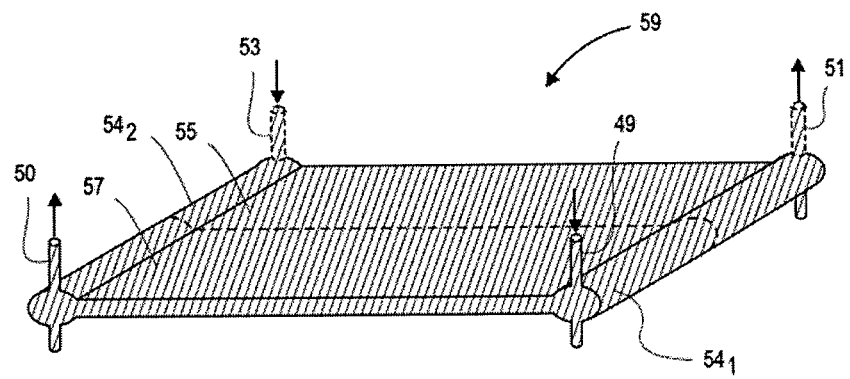
FIG. 4 illustrates an embodiment of a cooled partition found within the rack system.

FIG. 4 is an embodiment of a cooled partition 59. The cooled partition 59 includes coolant distribution nodes $54_1$ and $54_2$, which are connected to the coolant inlet 49 and the coolant outlet 50, respectively. The cooled partition 59 internally includes channels (not shown) that facilitate coolant flow between each coolant distribution node $54_1$ and $54_2$ to cool each side of the cooled partition 59. The internal channels may be configured in any suitable way known in the art, such as a maze of veins composed of flattened tubing, etc. The coolant distribution nodes $54_1$ and $54_2$ may include additional structures to limit or equalize the rate and distribution of coolant flow along the each axis of the coolant distribution node and through the cooled partition. Additionally, the coolant inlet 49 and the coolant outlet 50 may be caddy-corner or diagonal to each other depending on the rack design and the channel design through the cooled partition 59.

In another embodiment, the cooled partition 59 may be divided into two portions, partition portion 55 and partition portion 57. Partition portion 57 includes existing coolant inlet 49 and coolant outlet 50. However, the partition portion 55 includes its own coolant outlet 51 and coolant inlet 53. The partition portions 55 and 57 may be independent of each other and have their own coolant flow from inlet to outlet. For example, the coolant flow may enter into coolant inlet 49 of partition portion 57, work its way through cooling channels and out o the coolant outlet 50. Similarly, coolant flow may enter coolant inlet 53 of partition portion 55, through its internal cooling channels and out of coolant outlet 51. In another embodiment, the coolant inlet 49 and the coolant inlet 53 may be on the same side of the partition portion 55 and the partition portion 57, respectively. Having the coolant inlets and outlets on opposite corners may have beneficial cooling characteristics in having a more balanced heat dissipation throughout the cooled partition 59.

In another embodiment, the partition portions 55 and 57 are connected such that coolant may flow from one partition portion to the next either through one or both of the coolant distribution nodes $54_1$ and $54_2$ and through each partition portions' cooling channels. In this embodiment, based on known coolant flow characteristics, it may be more beneficial to have the coolant inlet 49 and the coolant inlet 53 on the same side of the partition portion 55 and the partition portion 57, and similarly the outlets 50 and 51 on the side of the partition portions 55 and 57.

Figure 5:
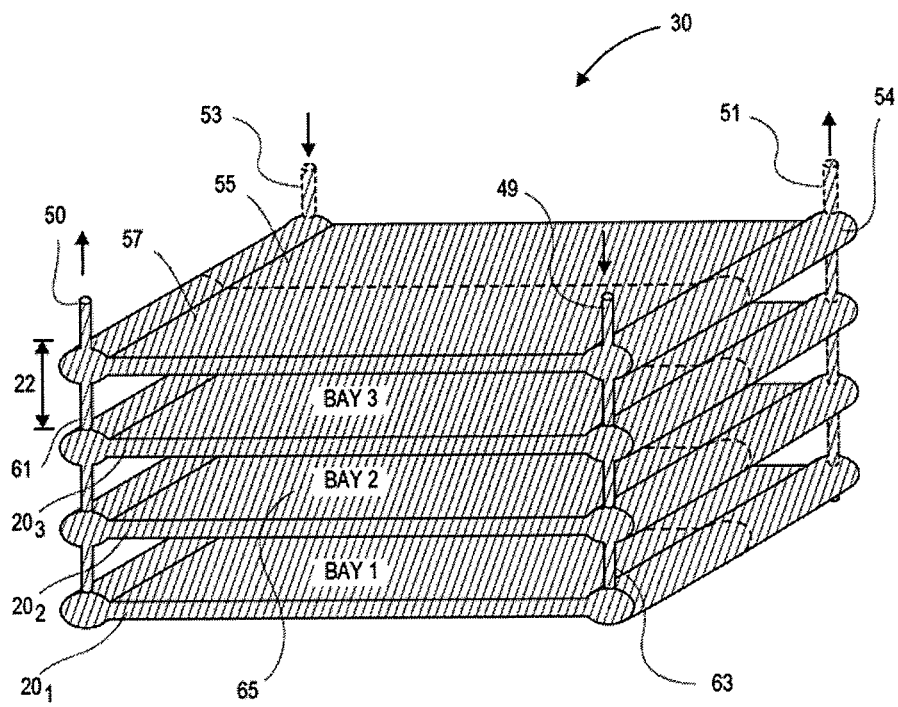
FIG. 5 illustrates an embodiment of several cooled partitions making up the module bays as viewed outside of the rack system.

FIG. 5 is an embodiment of the cooled partitions $20_1$, $20_2$, $20_3$, and $20_4$ of module bays 30 outside of the rack system 10 and provides another illustration of the module bay 65. Each cooled partition may have the same functionality as described in FIG. 4 with respect to cooled partition 59. Each cooled partition is physically connected by the coolant pipe 61 and the coolant pipe 63, which provide system wide coolant flow between all cooled partitions within the rack system 10. As with the cooling partition 59 of FIG. 4, in another embodiment the cooled partitions $20_1$, $20_2$, $20_3$, and $20_4$ may have an additional coolant outlet 51 and coolant inlet 53 and associated piping similar to coolant pipes 61 and 63. In other embodiments, the configuration of the inlets and outlets may vary depending on the desired coolant flow design. For example, the two inlets may be on opposite diagonal corners or on the same side depending on the embodiment designed to, such as including partition portions, etc., as discussed above with reference to FIG. 4.

In one embodiment, the bottom and top surfaces of the cooled partitions $20_1$, $20_2$, $20_3$, and $20_4$ are heat conductive surfaces. Because coolant flows between these surfaces they are suited to conduct heat away from any fixture or apparatus placed in proximity to or in contact with either the top or bottom surface of the cooled partitions, such as the surfaces of cooled partitions $20_2$ and $20_3$ of module bay 65. In various embodiments, the heat conductive surfaces may be composed of many heat conductive materials known in the art, such as aluminum alloy, copper, etc. In another embodiment, the heat conductive surfaces may be a mixture of heat conducting materials and insulators, which may be specifically configured to concentrate the conductive cooling to specific areas of the apparatus near or in proximity to the heat conductive surface.

Figure 6:
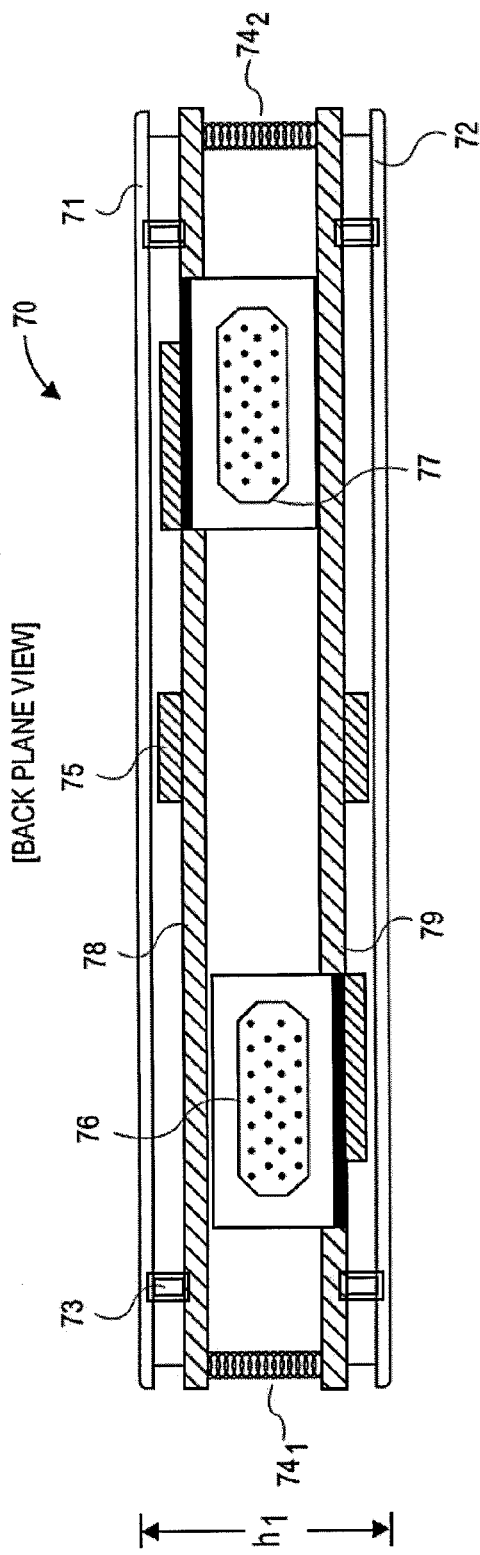
FIGS. 6 and 7 illustrate embodiments of a module fixture that includes circuit cards and components that make up a functional module in a service unit.
Figure 7:
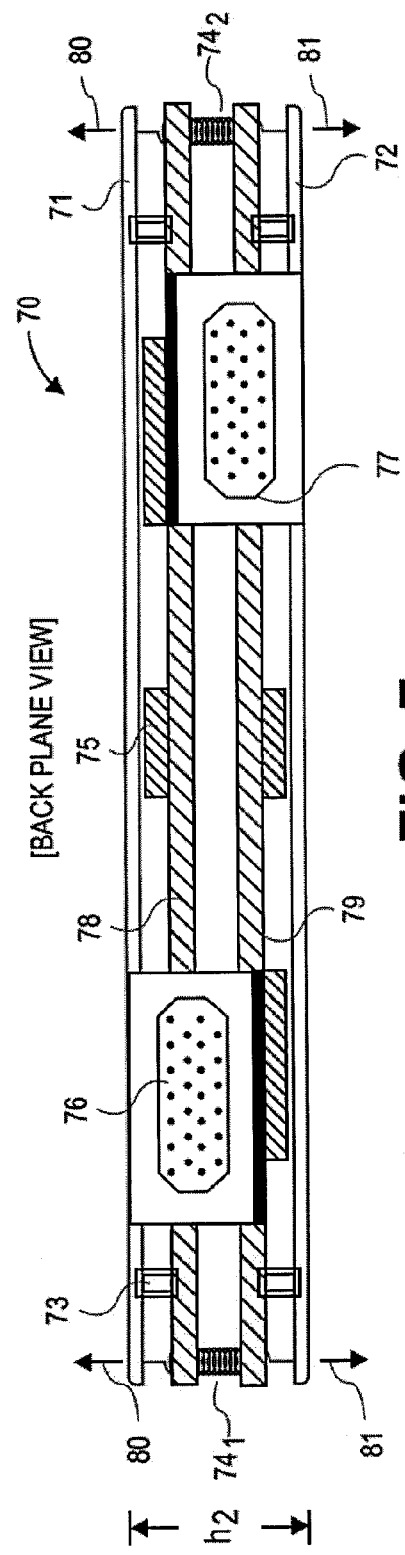

FIGS. 6 and 7 are each embodiments of a module fixture 70 that may include circuit cards and components that make up a functional module in a service unit, such as the four processing modules 32 insertable into the module bay 65 as discussed with reference to FIGS. 1, 2, and 5. The module fixture 70 includes thermal plates 71 and 72, fasteners 73, tensioners $74_1$ and $74_2$, component 75, connector 76, connector 77, and component boards 78 and 79.

In one embodiment, the component boards 78 and 79 are a multi-layered printed circuit board (PCB) and are configured to include connectors, nodes and components, such as component 75, to form a functional circuit. In various embodiments, the component board 78 and the component board 79 may have the same or different layouts and functionality. The component boards 78 and 79 may include the connector 77 and the connector 76, respectively, to provide input and output via a connection to the backplane (e.g., cluster unit backplane 38) through pins or other connector types known in the art. Component 75 is merely an example component and it can be appreciated that a component board may include many various size, shape, and functional components that still may receive the unique benefits of the cooling, networking, power and form factor of the rack system 10.

The component board 78 may be mounted to the thermal plate 71 using fasteners 73 and, as discussed below, will be in thermal contact with at least one and preferably two cooled partitions when installed into the rack system 10. In one embodiment, the fasteners 73 have a built in standoff that permits the boards' components (e.g., component 75) to be in close enough proximity to the thermal plate 71 to create a thermal coupling between the component 75 and at least a partial thermal coupling to the component board 78. In one embodiment the component board 79 is opposite to and facing the component board 78 and may be mounted and thermally coupled to the thermal plate 72 in a similar fashion as component board 78 to thermal plate 71.

Because of the thermal coupling of the thermal plates 71 and 72—which are cooled by the cooling partitions of the rack system 10—and the components of the attached boards, (e.g., component board 78 and component 75) there is no need to attach a heat-dissipating component, such as a heat sink, to the components. This allows the module fixture 70 to have a low profile permitting a higher density or number of module fixtures, components, and functionality in a single rack system, such as the rack system 10 and in particular the portion that is the universal hardware platform 21.

In another embodiment, if a component height is sufficiently higher than another component mounted on the same component board, the lower height component may not have a sufficient thermal coupling to the thermal plate for proper cooling. In this case, the lower height component may include a heat-dissipating component to ensure an adequate thermal coupling to the thermal plate.

In one embodiment, the thermal coupling of the thermal plates 71 and 72 of the module fixture 70 is based on direct contact of each thermal plate to their respective cooled partitions, such as the module bay 65 which include cooled partitions $20_3$ and $20_4$ shown in FIGS. 2, 3, and 5 above. To facilitate the direct contact, thermal plates 71 and 72 may each connect to an end of a tensioning device, such as tensioners $74_1$ and $74_2$. In one embodiment, the tensioners are positioned on each side and near the edges of the thermal plates 71 and 72. For example, tensioners $74_1$ and $74_2$ may be springs in an uncompressed state resulting in a module fixture height $h_1$, as shown in FIG. 6, where $h_1$ is larger than the height of the module bay 65 including cooled partitions $20_3$ and $20_4$.

FIG. 7 illustrates the module fixture 70 when the thermal plates 71 and 72 are compressed towards each other to a height of $h_2$, where $h_2$ is less than or equal to the height or distance between the cooled partitions $20_3$ and $20_4$ of the module bay 65. Thus, when the module fixture is inserted into the module bay 65 there is an outward force 80 and an outward force 81 created by the compressed tensioners $74_1$ and $74_2$. These outward forces provide a physical and thermal contact between the cooled partitions $20_3$ and $20_4$ and the thermal plates 71 and 72. As coolant flows through each partition, as described with respect to FIG. 5, it conductively cools the boards and components of the module fixture 70.

The tensioners $74_1$ and $74_2$ may be of any type of spring or material that provides a force creating contact between the thermal plates and the cooling partitions. The tensioners $74_1$ and $74_2$ may be located anywhere between the thermal plates 71 and 72, including the corners, the edges or the middle, and have no limit on how much they may compress or uncompress. For example, the difference between $h_1$ and $h_2$ may be as small as a few millimeters or as large as several centimeters. In other embodiments, the tensioners $74_1$ and $74_2$ may pass through the mounted component boards or be between and couple to the component boards or any combination thereof. The tensioners may be affixed to the thermal plates or boards by any fastening hardware, such as screws, pins, clips, etc.

FIGS. 8 and 9 are embodiments of the module fixture 70 from a side view in a compressed and uncompressed state respectively. As shown in FIGS. 6 and 7 the connectors 76 and 77 do not overlap, and in this embodiment, are on different sides as seen from the back plane view. FIGS. 8 and 9 further illustrate the connectors 76 and 77 extend out from the edge of the thermal plates 71 and 72 such that they may overlap the thermal plates when the module fixture 70 is compressed down to the height of $h_2$. For example, the connector 76 of the bottom component board 79, when compressed, is relatively flush with the thermal plate 71 on top and the connector 77 of the top component board 78 is relatively flush with the thermal plate 72 on the bottom. In this particular embodiment, the connectors 76 and 77 will determine the minimum $h_2$, or in other words how much the fixture 70 may be compressed. The smaller the fixture 70 may be compressed the smaller the pitch (P) may be between cooling partitions and the higher the density of functional components per rack system, and specifically the universal hardware platform 21 portion of the rack system 10.

FIGS. 10 and 11 are each embodiments of a module fixture 89 for a rack power board insertable into the rack power section 19 of the rack system 10. The module fixture 89 includes a thermal plates 87 and 88, fasteners 83, tensioners $84_1$ and $84_2$, component 85, connector 86, and component board 82.

Thus, in a similar way as described above with respect to the module fixture 70 in FIGS. 6 and 7, when the module fixture is inserted into a module bay in the rack power section 19 there is an outward force 90 and an outward force 91 created by the compressed tensioners $84_1$ and $84_2$. These outward forces provide a physical and thermal contact between the cooled partitions of the rack power section 19 and the thermal plates 87 and 88. Therefore, the component board 82 and components (e.g., component 85) of the module fixture 89 are conductively cooled as coolant flows through the relevant cooled partitions.

The embodiments described above may provide for compact provision of processing, switching and storage resources with efficient heat removal. However, in some situations, the provision of the above characteristics may be accompanied by a requirement for a relatively large number of cables to enable communications between different rack systems 10 and perhaps also external devices or networks. If cables or network lines were merely provided down the perimeter frame 12 and excess cable was not properly managed, heat removal efficiency could be reduced and/or general disorder could exist among the cables. Accordingly, some embodiments of the present invention may provide a cable slack management system for handling excess cable or cable slack.

Figure 12:
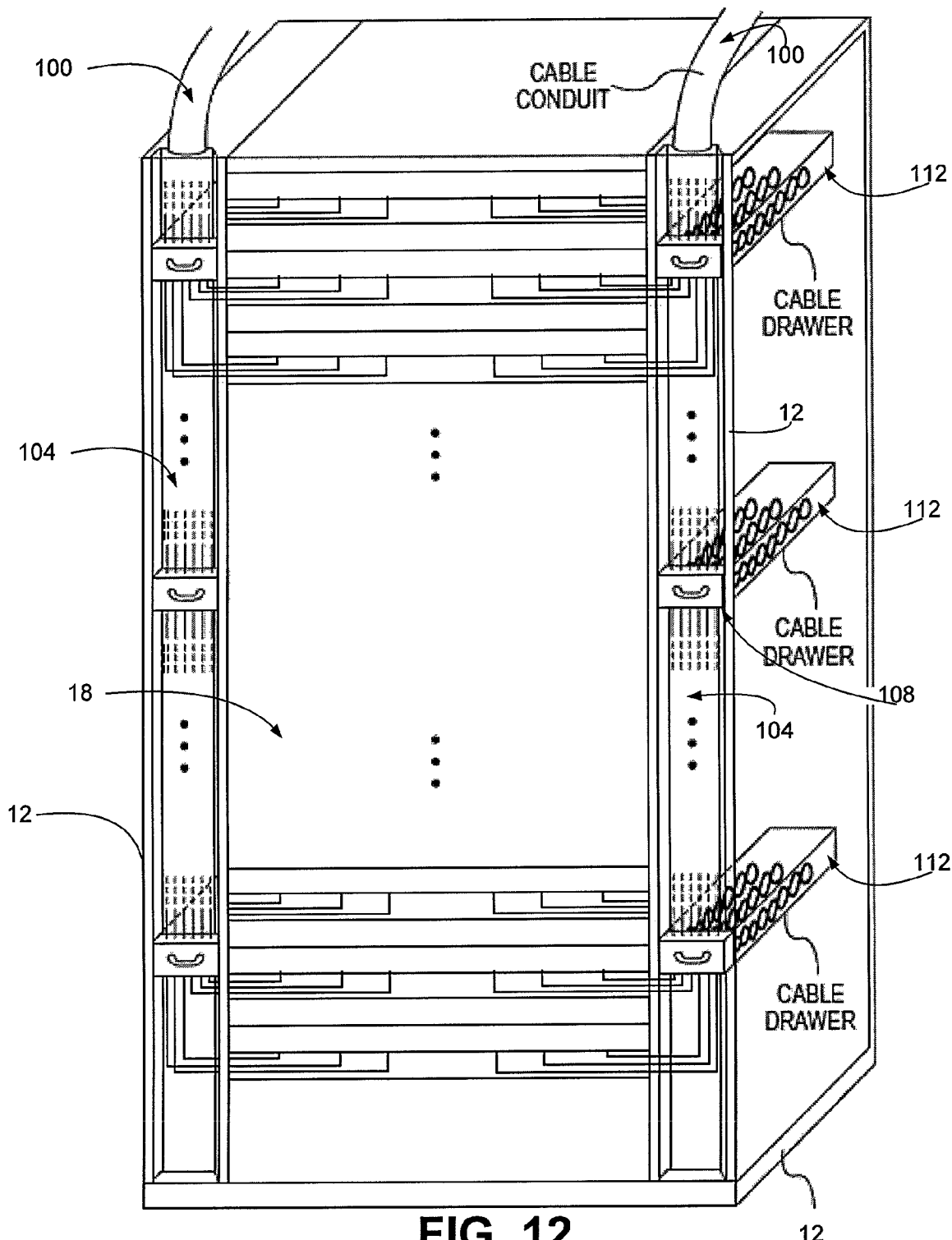
FIG. 12 illustrates an example embodiment employing a cable slack management system.

FIG. 12 illustrates an example of a cable slack management system in accordance with an example embodiment. In some embodiments, cabling may be provided in a cable conduit 100 that may enter the rack system 10 from above (e.g., via the rack top 16) into the perimeter frame 12. Cable may then proceed down the perimeter frame 12 via a cable way 104. The cable way 104 may extend down the length of the interior portion of the perimeter frame 12 to avoid interference with the service units of the rack system 10. In some embodiments, the cable way 104 may extend down either or both members of the perimeter frame 12 that are positioned in the rack front 18. In an exemplary embodiment, the perimeter frame 12 may include one or more drawer enclosures 108 positioned in the perimeter frame to receive a cable drawer 112. In an exemplary embodiment, the drawer enclosures 108 may be orifices within the perimeter frame 12 of the rack front 18 that permit insertion of corresponding cable drawers 112 within the rack system 10 in a direction that is substantially normal to a plane of the rack front 18. Thus, the individual frame members that form the front portion of the rack system 10 may be coupled to the drawer enclosures 108 in order to receive the cable drawers 112 in a location that is easily accessible to users.

Although FIG. 12 shows six cable drawers 112 positioned substantially equidistant from one another and symmetrical with respect to a centerline of the rack front 18, any number of cable drawers 112 could be used and the cable drawers 112 could be positioned in any desirable way. The cable drawers 112 may then be employed to contain cable slack therein to prevent excess cable from being positioned within the rack system 10 in an unorganized fashion. The cable drawers 112 may be removable from the corresponding drawer enclosures 108 or at least be extendable therefrom in order to permit access to the inside of the cable drawers 112. Although the above description refers to "drawer" enclosures and cable "drawers", it should be noted that the cable slack could be managed in any cable management module and thus the term "drawer" is merely used for exemplary purposes. The cable management module may be any retractable apparatus that has at least a frame (with or without any sidewalls and/or top/bottom walls) cable of supporting a structure or structures for permitting cable to be wound around the structure(s) to take up cable slack as described above.

Although an embodiment of the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A cooled universal hardware platform, comprising:
a frame;
a plurality of cooled partitions coupled within the frame;
a plurality of module bays each defined by consecutive cooled partitions of the plurality of cooled partitions;
a component module in a first module bay of the plurality of module bays, the component module comprising:
a first thermal plate substantially parallel to a second thermal plate, wherein each thermal plate includes an inner surface and an outer surface, the inner surface of the first thermal plate facing the inner surface of the second thermal plate, the first thermal plate and second thermal plate configured to have a variable spacing therebetween by a bias that urges the first thermal plate away from the second thermal plate; and
at least one first component unit located between the inner surface of the first thermal plate and the inner surface of the second thermal plate; and
a coolant source in fluid communication with the plurality of cooled partitions.

2. The cooled universal hardware platform of claim 1, wherein the component module further includes the one or more tensioning units configured to generate the bias and provide a first contact bias between the outer surface of the first thermal plate and the first cooled partition and a second contact bias between the outer surface of the second thermal plate and the second cooled partition.

3. The cooled universal hardware platform of claim 1, wherein each of the plurality of cooled partitions includes a first partition surface, a second partition surface and at least one channel between the first partition surface and the second partition surface, the at least one channel configured to receive the coolant for coolant flow.

4. The cooled universal hardware platform of claim 1, wherein the first cooled partition of the plurality of cooled partitions includes:
a first coolant distribution node located at a first edge of the first cooled partition and coupled to the coolant source by a first coolant pipe, wherein the first coolant distribution node is configured to distribute the coolant within the first cooled partition; and
a second coolant distribution node located at a second edge of the first cooled partition and configured to receive the coolant after the coolant passes from the first coolant distribution node and through the first cooled partition, the second coolant distribution node coupled to the coolant source by a second coolant pipe.

5. The cooled universal hardware platform of claim 1, wherein the first cooled partition of the plurality of cooled partitions includes:
a first partition portion configured to allow coolant flow within the first partition portion in a first direction; and
a second partition portion configured to allow coolant flow within the second partition portion in a second direction opposite the first direction.

6. The cooled universal hardware platform of claim 1, wherein the first cooled partition of the plurality of cooled partitions includes:
a first partition portion configured to allow coolant flow within the first partition portion; and
a second partition portion configured to allow coolant flow within the second partition portion; and
wherein the first partition portion is independent of the second partition portion such that the coolant does not directly flow between the first partition portion and the second partition portion.

7. The cooled universal hardware platform of claim 1, wherein the first cooled partition of the plurality of cooled partitions includes:
a first partition portion including:
a first coolant distribution node located at a first edge of the first cooled partition and coupled to a first coolant pipe, the first coolant distribution node configured to distribute the coolant within the first partition portion; and
a second coolant distribution node located at a second edge of the first cooled partition and coupled to a second coolant pipe, the second coolant distribution node configured to receive the coolant after the coolant passes through the first partition portion; and
a second partition portion including:
a third coolant distribution node located at the second edge of the first cooled partition and coupled to a third coolant pipe, the third coolant distribution node configured to distribute the coolant within the second partition portion; and
a fourth coolant distribution node located at the first edge of the first cooled partition and coupled to a fourth coolant pipe, the fourth coolant distribution node configured to receive the coolant after the coolant passes through the second partition portion.

8. The cooled universal hardware platform of claim 1, wherein the first cooled partition of the plurality of cooled partitions includes:
a first partition portion including:
a first coolant distribution node located at a first edge of the first cooled partition and coupled to a first coolant pipe, the first coolant distribution node configured to distribute the coolant within the first partition portion; and
a second coolant distribution node located at a second edge of the first cooled partition and coupled to a second coolant pipe, the second coolant distribution node configured to receive the coolant after the coolant passes through the first partition portion; and
a second partition portion including:
a third coolant distribution node located at the first edge of the first cooled partition and coupled to a third coolant pipe, the third coolant distribution node configured to distribute the coolant within the second partition portion; and
a fourth coolant distribution node located at the second edge of the first cooled partition and coupled to a fourth coolant pipe, the fourth coolant distribution node configured to receive the coolant after the coolant passes through the second partition portion.

9. The cooled universal hardware platform of claim 8, wherein the first coolant distribution node and the third coolant distribution node include a coolant flow connection such that the coolant may flow between the first partition portion and the second partition portion via the coolant flow connection.

10. The cooled universal hardware platform of claim 8, wherein:
the first partition portion includes at least one first channel and the second partition portion includes at least one second channel; and
the at least one first channel and the at least one second channel include a coolant flow connection such that the coolant may flow between the first partition portion and the second partition portion via the coolant flow connection.

11. The cooled universal hardware platform of claim 1, wherein the one or more first component units each includes a first component board and one or more first components.

12. The cooled universal hardware platform of claim 11, wherein:
the first thermal plate is configured to physically and thermally couple the one or more first component units;
the second thermal plate is configured to physically and thermally couple one or more second component units to its inner surface, the one or more second component units each including a second component board and one or more second components.

13. The cooled universal hardware platform of claim 1, wherein each of the plurality of module bays have a pitch equal to a distance defined by the first cooled partition and the second cooled partition of the plurality of cooled partitions, the pitch corresponding with a standard unit of height.

14. The cooled universal hardware platform of claim 1 further comprising a power bus configured to deliver power to the component module.

15. The cooled universal hardware platform of claim 14 further comprising a rack power module inserted into a second module bay of the plurality of module bays, the rack power module configured to convert alternating current (AC) to direct current (DC), and wherein the power bus configured to receive the DC from the rack power module and deliver the DC to the component module.

16. The cooled universal hardware platform of claim 1, further comprising a backplane on a second side of the rack opposite a first side, the backplane configured to receive at least one connector of the component module.

17. A cooled universal hardware platform, comprising:
a frame;
a plurality of cooled partitions coupled within the frame;
a plurality of module bays each defined by two consecutive cooled partitions of the plurality of cooled partitions;
a component module removably inserted into a first module bay of the plurality of module bays, the first module bay defined by a volume of space between a first cooled partition and a second cooled partition of the plurality of cooled partitions, the component module comprising:
a first thermal plate and a second thermal plate, wherein each thermal plate includes an inner surface and an outer surface, the inner surface of the first thermal plate facing the inner surface of the second thermal plate and separated by a distance;
one or more first component units thermally coupled to the inner surface of the first thermal plate; and
the distance between the first thermal plate and the second thermal plate is configured to be adjustable; and
a coolant source coupled to the plurality of cooled partitions to provide coolant to the plurality of cooled partitions.

18. The cooled universal hardware platform of claim 17, wherein the component module includes one or more tensioning units configured to create a bias that urges the distance between the first thermal plate and the second thermal plate to be greater than a distanced defined between the first cooled partition and the second cooled partition when the component module is removed from the first module bay.

19. A cooled universal hardware platform, comprising:
a frame;
a plurality of cooled partitions coupled within the frame;
a plurality of module bays each defined by a volume of space between two consecutive cooled partitions of the plurality of cooled partitions;
a component module inserted into a module bay of the plurality of module bays between a first cooled partition and a second cooled partition of the plurality of cooled partitions, the component module comprising:
a first thermal plate and a second thermal plate, wherein each thermal plate includes an inner surface and an outer surface, the inner surface of the first thermal plate facing the inner surface of the second thermal plate;
the first thermal plate is thermally coupled to one or more first component units on its inner surface and to the first cooled partition on its outer surface; and
the second thermal plate is thermally coupled to the second cooled partition on its outer surface; and
a coolant source coupled to the plurality of cooled partitions.

20. The cooled universal hardware platform of claim 19, wherein:
the one or more first component units each includes a first component board and one or more first components;
the second thermal plate is configured to thermally couple one or more second component units to its inner surface, the one or more second component units each including a second component board and one or more second components.

* * * * *

UNITED STATES PATENT AND TRADEMARK OFFICE
CERTIFICATE OF CORRECTION

| | | |
|---|---|---|
| PATENT NO. | : 9,113,580 B2 | |
| APPLICATION NO. | : 13/776340 | |
| DATED | : August 18, 2015 | |
| INVENTOR(S) | : Dunwoody et al. | |

It is certified that error appears in the above-identified patent and that said Letters Patent is hereby corrected as shown below:

In the claims:

Column 16, Line 14, "a distanced defined" should read --a distance defined--.

Signed and Sealed this
Twenty-ninth Day of March, 2016

Michelle K. Lee
*Director of the United States Patent and Trademark Office*